United States Patent
Vaillant

(10) Patent No.: US 9,881,965 B2
(45) Date of Patent: Jan. 30, 2018

(54) BACK-SIDE IMAGE SENSOR

(75) Inventor: Jérôme Vaillant, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 12/892,372

(22) Filed: Sep. 28, 2010

(65) Prior Publication Data

US 2011/0073976 A1    Mar. 31, 2011

(30) Foreign Application Priority Data

Sep. 30, 2009 (FR) ...................... 09 56775

(51) Int. Cl.
  *H01L 31/0232* (2014.01)
  *H01L 27/146* (2006.01)

(52) U.S. Cl.
  CPC .... *H01L 27/14645* (2013.01); *H01L 27/1464* (2013.01)

(58) Field of Classification Search
  CPC .................................. H01L 27/1464
  USPC ........................ 257/432, E31.038
  See application file for complete search history.

(56) References Cited

U.S. PATENT DOCUMENTS

| 6,423,980 | B1 * | 7/2002 | Wilson | B82Y 20/00 |
| | | | | 257/21 |
| 2006/0011955 | A1 | 1/2006 | Baggenstoss | |
| 2007/0091190 | A1 | 4/2007 | Iwabuchi et al. | |
| 2007/0194401 | A1 | 8/2007 | Nagai et al. | |
| 2009/0020838 | A1 * | 1/2009 | Lin et al. | 257/432 |
| 2009/0096900 | A1 | 4/2009 | Pang et al. | |
| 2009/0200586 | A1 | 8/2009 | Mao et al. | |
| 2009/0200625 | A1 * | 8/2009 | Venezia et al. | 257/432 |

OTHER PUBLICATIONS

French Search Report dated May 21, 2010 from corresponding French Application No. 09/56775.

* cited by examiner

*Primary Examiner* — Hsin-Yi Hsieh
(74) *Attorney, Agent, or Firm* — Seed IP Law Group LLP

(57) ABSTRACT

A color back-side illuminated image sensor including, on the side of the thin semiconductor layer opposite to the illuminated surface, periodic thickness unevennesses forming an optic network having characteristics which make it capable of reflecting a given wavelength chosen within the range of the wavelengths of an illuminating incident beam.

21 Claims, 2 Drawing Sheets

BACK-SIDE IMAGE SENSOR

CROSS REFERENCE TO RELATED APPLICATIONS

This application claims the priority benefit of French patent application number 09/56775, filed on Sep. 30, 2009, entitled "BACK-SIDE IMAGE SENSOR," which is hereby incorporated by reference to the maximum extent allowable by law.

BACKGROUND OF THE INVENTION

Field of the Invention

The present invention generally relates to the monolithic construction of imagers. More specifically, the present invention relates to the structure of image sensors of back-side illuminated sensor type, presently called back-side sensors.

Discussion of the Related Art

An image sensor is formed of an array of cells capable of performing a photoelectric transformation. The cells are arranged at the nodes of an array of lines and columns. Each cell comprises a photodiode associated with a transfer transistor and possibly other transistors.

An example of a back-side sensor will be described in relation with FIGS. 1A to 1E, which are partial simplified cross-section views illustrating successive steps of the construction of such a sensor.

FIG. 1A shows a wafer of silicon-on-insulator type (SOI) comprising a thin single-crystal silicon layer 1 separated by an insulating layer 3 from a solid substrate 5. Thin layer 1 is lightly P-type doped. The method comprises an initial step of etching trenches 7 intended to delimit the areas in which the elementary cells, especially comprising a photodiode and its transfer transistor, will be formed. At this stage of the process, insulating layers 7 filled with an insulating material are generally also formed at the limits between the areas where the elementary cell are formed, to provide a so-called STI isolation (shallow trench isolation) between these cells.

FIGS. 1A to 1E only illustrate four insulating trenches 7 delimiting three areas where individual cells are to be formed, each cell being comprised of a photodiode associated with its transfer transistor.

As illustrated in FIG. 1B, trenches 7 are generally surrounded with a P-type region 9 more heavily doped than thin layer 1. Then, insulated gates 11 of the MOS transistors are formed on thin layer 1. N-type doped drain and source regions 13 and 15 are formed by implantation/diffusion on either side of gates 11. The transfer transistors are asymmetrical. In each cell, source 15 is smaller than drain 13 which forms the cathode of the photodiode. Drain 13 takes up the most part of each cell.

The surface of drain region 13 may be covered with a P-type inversion region 17 of small thickness, more heavily-doped than thin layer 1. Thin layer 1 is covered with a succession of interconnect levels providing the necessary connections. These interconnect levels comprise metallizations and vias (not referenced) formed between successive insulating layers 21, 23, 25. Only three insulating layers are shown. They may, however, be in a greater number, for example, between four and nine.

Then, as shown in FIG. 1C, a wafer of a semiconductor material or handle wafer 30 is attached to the structure on an insulating layer 28 coating the last interconnect level.

As illustrated in FIG. 1D, substrate 5 is then removed, generally by chem.-mech. polishing, to expose the back side of thin layer 1.

As illustrated in FIG. 1E, the back side is then successively covered with a heavily-doped P-type layer 32, and with color filters 34 and lenses 36 associated with each cell.

In operation, an incident light beam of the visible spectrum is focused by lenses 36 in the various cells through filters 34. Within the incident beam the photons of a wavelength range selected by filter 34 are converted by photoelectric effect into carriers (electrons) and are stored in cathode/drain region 13, whereby they are transferred to read and analysis circuits, not shown, by the transfer transistors.

A problem encountered in the manufacturing of such sensors is the selection of the thickness of thin layer 1 which forms the area where the photons are transformed into electric charges. On the one hand, to avoid interference effects between neighboring cells, this layer should be as thin as possible: typically equivalent to the size of the pixel, that is, from 1 to 2 μm for a pixel having a 1.4-μm side. Such thicknesses guarantee a conversion quantum efficiency close to 100% for short wavelengths, that is, in blue and green, but result in an efficiency loss ranging from 30 to 60% for wavelengths in the red wavelength range. On the other hand, this layer should be sufficiently thick for most of the incident photons to be converted: it should be more than 5-μm thick to guarantee the absorption of 90% of the photons corresponding to the red portion of the visible spectrum.

Such constraints lead to use thin layers 1 having a thickness from 2 to 3 μm.

To overcome this loss, it has been provided to place a reflective metal layer on the side of the transistor gates so that the photons which have not been converted transit for a second time through the photoelectric conversion layer.

However, the insertion of an additional metal element in the structure has the disadvantage of causing stray capacitive couplings.

Further, in microelectronics, all metals are normally processed and deposited to be non-reflective. Introducing a reflective metal layer may require significant modifications of the manufacturing conditions.

SUMMARY OF THE INVENTION

An object of an embodiment of the present invention is to provide a back-side sensor having an improved quantum efficiency.

Another object of an embodiment of the present invention is to provide such a sensor without increasing the thickness of the thin layer in which the components are formed.

Another object of an embodiment of the present invention is to provide such a sensor without modifying the structure of the transfer transistor.

Another object of an embodiment of the present invention is to provide such a sensor without requiring the introduction of new materials in the manufacturing processes, nor of additional specific processings of currently-used materials.

Thus, an embodiment of the present invention provides a color back-side illuminated image sensor comprising, on the side of the thin semiconductor layer opposite to the illuminated surface, periodic thickness unevennesses forming an optic network having characteristics which make it capable of reflecting a given wavelength of the visible spectrum selected within the range of the wavelengths of the incident illuminating beam.

According to an embodiment of the present invention, the unevennesses correspond to recesses in the silicon, which are filled with silicon oxide.

According to an embodiment of the present invention, the unevennesses are pads separated by trenches.

According to an embodiment of the present invention, optic networks are only provided for the sensor cells associated with filters transmitting red light.

The foregoing objects, features, and advantages of the present invention will be discussed in detail in the following non-limiting description of specific embodiments in connection with the accompanying drawings.

DETAILED DESCRIPTION

Figure 1A:
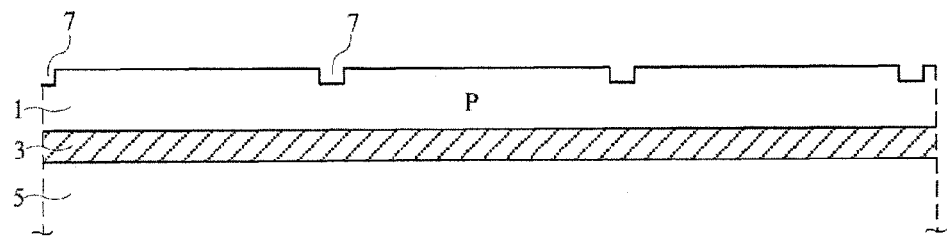
FIGS. 1A to 1E partially and schematically illustrate in cross-section view successive steps of the manufacturing of an image sensor.
Figure 1B:
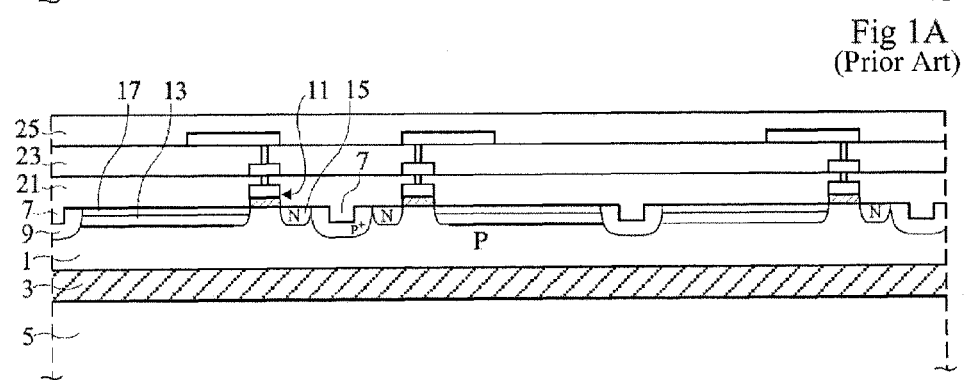
Figure 1C:
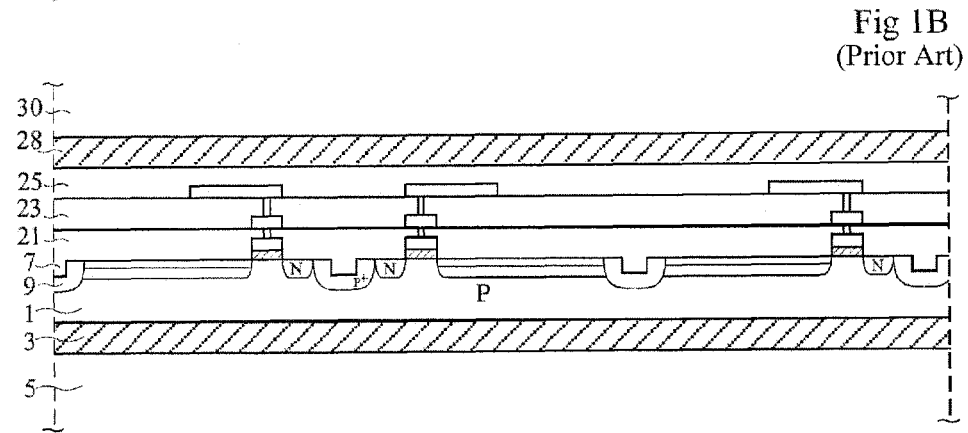
Figure 1D:
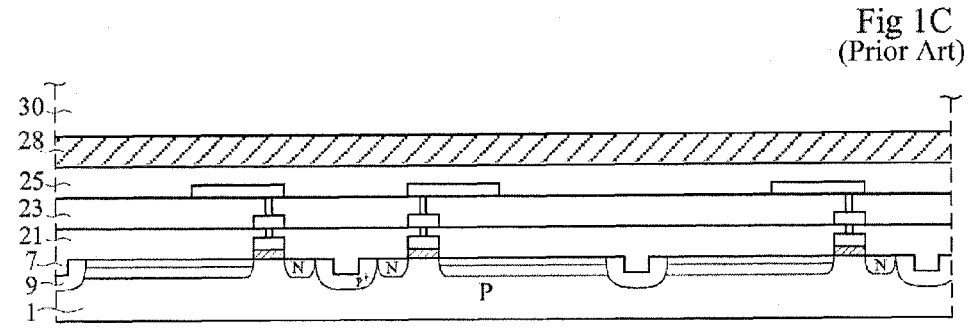
Figure 1E:
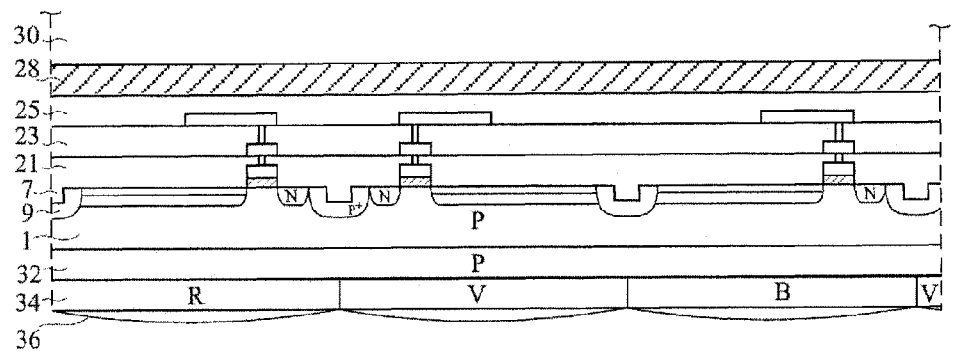

For clarity, the same elements have been designated with the same reference numerals in the different drawings and, further, as usual in the representation of integrated circuits, the various drawings are not to scale.

Figure 2A:
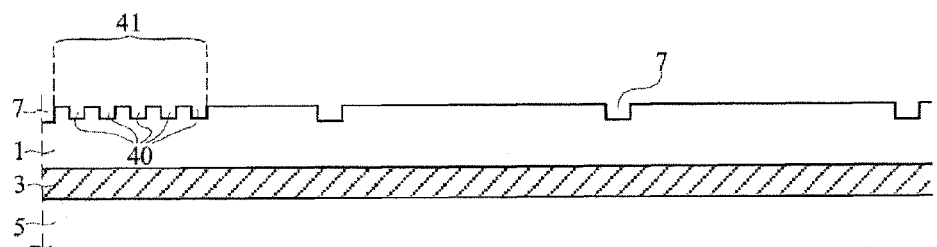
FIG. 2A is a partial simplified cross-section view of an image sensor according to an embodiment of the present invention at an intermediary stage of its manufacturing.

FIG. 2A shows a single-crystal substrate, of the same type as that of FIG. 1A, for example, formed of a thin semiconductor layer 1 of a structure of silicon-on-insulator type separated by a thin insulator 3, presently silicon oxide, from a solid substrate 5. The method comprises an initial step of delimitation of portions of thin layer 1 in which elementary cells of the sensor are to be formed. This delimitation is performed by the etching of trenches 7. At this stage, recesses 40 are simultaneously etched into thin layer 1 to form, at the surface of thin layer 1, an unevenness area 41. According to an embodiment, recesses 40 are etched so that unevennesses 41 are square pads rather than rectilinear trenches. The location of area 41 and the unevenness distribution will be described subsequently.

The method carries on with steps similar to those described in relation with FIGS. 1B to 1E, especially comprising the filling of trenches 7 and 40, the forming of insulated gates 11, the forming of different implanted regions 9, 13, 15, and 17, the forming of interconnect levels 21, 23, and 25, the arranging of a handle wafer on the metallization levels, a thinning-down capable of exposing the back side of thin layer 1 by removal of substrate 5 and of at least a portion of insulating layer 3, and the forming of filters 34 and of lenses 36. The result of these different steps is illustrated in FIG. 2B.

Figure 2B:
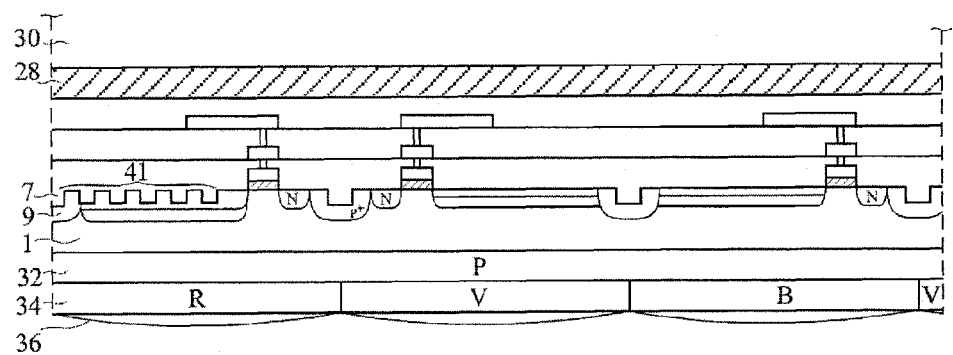
FIG. 2B is a partial simplified cross-section view of an image sensor according to an embodiment of the present invention at a final manufacturing stage.

As shown in FIG. 2B, unevenness area 41 is arranged to be located in an elementary cell having a red filter 34, outside of the transfer transistor forming area, at the level of the portion of the surface of thin layer 1 located right above cathode/drain region 13.

Unevennesses 41 form a periodic pattern formed of pads surrounded with trenches. These pads may have a square base, but will preferably have a circular or hexagonal basis to avoid privileging a specific type of light biasing. Period Λ of the pattern, height d of the pads, as well as the ratio between the width of the pads and the width of the interval separating them are selected so that the periodic unevennesses altogether form a two-dimensional optic network capable of reflecting wavelengths corresponding to the color red of the visible spectrum.

Thus, an incident illuminating beam crossing a red filter 34 is reflected by unevenness area 41 and crosses back cathode region 13. This amounts to virtually doubling the thickness of cathode region 13. The probability of occurrence of a photoelectric effect is thus doubled.

An advantage of such a structure is that the reflection effect is better with a two-dimensional network than with a reflective layer.

Another advantage is that this result is obtained without introducing any new material with respect to known structures. The manufacturing method is thus simple. In particular, unevennesses 41 may be formed without adding additional steps, by etching thin layer 1 to form the pads at the same time as STI-type insulation areas are etched in other portions of thin layer 1. Although the pads and their insulation areas have been shown with different widths, these widths may be identical.

According to an embodiment, thin layer 41 is a single-crystal silicon layer having a thickness from 3 to 5 μm and the insulating layer filling the interval between pads is a silicon oxide layer. It should be noted that the optical indexes of silicon and of silicon oxide are clearly differentiated, as they are respectively close to 4 and to 1.45, which is favorable to the obtaining of an efficient optic network.

For a photodiode associated with a red filter, unevennesses 41 will, for example, have the following characteristics:

period Λ: on the order of from 350 to 400 nm;
height d of the pads: on the order of from 50 to 300 nm;
ratio between the pad width and the distance between pads close to 1.

Specific embodiments of the present invention have been described. Various alterations and modifications will occur to those skilled in the art. In particular, the present invention has been described as applied to a specific type of back-side sensor based on photodiodes. This sensor is likely to have various alterations. Further, all back-side sensors are confronted to the same problem and the solution provided herein also applies to other back-side sensors. For example, the present invention also applies to sensors based on phototransistors or on photogates.

Further, it should be noted that unevennesses 41 have only been described in relation with an elementary cell associated with a red filter. This is a preferred embodiment of the present invention. Indeed, presently-used filters are always imperfect, and by avoiding reflection of red in green and blue cells, the conversion of the parasitic red light is limited in these cells. A specific array of pads with a specific step may, however, be provided for each color to reflect the desired color of the visible spectrum chosen within the range of the wavelengths of an illuminating incident beam.

Generally, although the present invention has been described in the context of a silicon process, it applies to any integrated circuit manufacturing process.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A color back-side illuminated image sensor comprising: first sensor cells and second sensor cells capable of performing a photoelectric transformation,
 a semiconductor substrate having a first side configured to be illuminated by an illuminating incident beam and a second side opposite to the first side; and
 optic networks formed by periodic thickness unevennesses in the second side of the semiconductor substrate, the optic networks having characteristics which make the optic networks capable of reflecting a given wavelength chosen within a range of the wavelengths of the illuminating incident beam, wherein the unevennesses extend only partially through the semiconductor substrate, wherein the periodic thickness unevennesses of the optic networks have a period configured to produce a reflectivity of the optical networks for light of the given wavelength, wherein the optic networks provided for the first sensor cells having filters configured to transmit only light of a first color corresponding to the given wavelength, the second sensor cells do not have the filters configured to transmit the light of the first color and do not have the optic networks.

2. The sensor of claim 1, wherein the unevennesses correspond to recesses in the semiconductor substrate, which are filled with silicon oxide.

3. The sensor of claim 1, wherein the unevennesses are protrusions separated by trenches.

4. The sensor of claim 1, wherein the light of the first color is red light.

5. A color back-side illuminated image sensor comprising: first sensor cells and second sensor cells capable of performing a photoelectric transformation,
 a semiconductor substrate having a front surface and a back surface, the back surface configured to be illuminated by an illuminating incident beam;
 a cathode region in the semiconductor substrate; and
 first optic networks located at the front surface of the semiconductor substrate and above the cathode region, the first optic networks having characteristics which makes the first optic networks capable of reflecting a first given wavelength chosen within a range of the wavelengths of the illuminating incident beam, the characteristics including a period selected based on the first given wavelength, wherein the first optic networks provided for the first sensor cells having first filters configured to transmit only light of a first color corresponding to the first given wavelength, the second sensor cells do not have the first filters configured to transmit the light of the first color and do not have the first optic networks.

6. The sensor of claim 5, wherein the first optic network comprises periodic unevennesses.

7. The sensor of claim 6, wherein the unevennesses correspond to recesses in the semiconductor substrate, the recesses being filled with silicon oxide.

8. The sensor of claim 6, wherein the unevennesses are protrusions separated by trenches.

9. The sensor of claim 5, wherein the light of the first color is red light.

10. A color back-side illuminated image sensor comprising: a plurality of first sensor cells and a plurality of second sensor cells capable of performing a photoelectric transformation,
 a semiconductor substrate having a front surface and a back surface, the back surface configured to be illuminated by an illuminating incident beam;
 the plurality of first sensor cells having respective first optic networks at the front surface of the semiconductor substrate, each of the first optic networks having characteristics which makes the first optic networks capable of reflecting a given wavelength chosen within a range of the wavelengths of an illuminating incident beam, the characteristics including a period selected based on the given wavelength, wherein the first sensor cells have first filters configured to transmit red light; and the plurality of second sensor cells do not have the first filters configured to transmit red light and do not have the first optic networks.

11. The sensor of claim 10, wherein each optic network comprises periodic unevennesses having the selected period.

12. The sensor of claim 10, wherein the unevennesses correspond to recesses in the semiconductor substrate, the recesses being filled with silicon oxide.

13. The sensor of claim 10, wherein the unevennesses are protrusions separated by trenches.

14. The sensor of claim 5, wherein the optic networks are capable of reflecting the first given wavelength of the illuminating incident beam towards the back surface.

15. The sensor of claim 10, wherein the optic networks are capable of reflecting the given wavelength of the illuminating incident beam towards the back surface.

16. The sensor of claim 6, wherein at least one of a period of the unevennesses, a height of the periodic unevennesses, and a ratio between a width of elements in the periodic unevennesses and a width of an interval separating the elements is chosen in order to cause the first given wavelength to be reflected.

17. The sensor of claim 16, wherein the period is approximately 350 to 400 nm, the height is approximately 50 to 300 nm, and the ratio is close to 1.

18. The sensor of claim 8, wherein the protrusions comprise pads.

19. The sensor of claim 18, wherein the pads have respective bases that are circular or hexagonal.

20. The sensor of claim 5, wherein the optic networks are associated with a single cell of the sensor, the single cell including a color filter configured to detect light of the first given wavelength.

21. The sensor of claim 5, further comprising:
 a second optic network having characteristics for reflecting a second given wavelength; and
 a third optic network having characteristics for reflecting a third given wavelength.

* * * * *